US012165840B2

(12) United States Patent
Pawlowicz et al.

(10) Patent No.: US 12,165,840 B2
(45) Date of Patent: Dec. 10, 2024

(54) ION BEAM DELAYERING SYSTEM AND METHOD, TOPOGRAPHICALLY ENHANCED DELAYERED SAMPLE PRODUCED THEREBY, AND IMAGING METHODS AND SYSTEMS RELATED THERETO

(71) Applicant: TechInsights Inc., Ottawa (CA)

(72) Inventors: Christopher Pawlowicz, Ottawa (CA); Alexander Sorkin, Nepean (CA)

(73) Assignee: TECHINSIGHTS INC., Ottawa (CA)

( * ) Notice: Subject to any disclaimer, the term of this patent is extended or adjusted under 35 U.S.C. 154(b) by 0 days.

(21) Appl. No.: 17/309,372

(22) PCT Filed: Nov. 20, 2019

(86) PCT No.: PCT/CA2019/051661
§ 371 (c)(1),
(2) Date: May 21, 2021

(87) PCT Pub. No.: WO2020/102899
PCT Pub. Date: May 28, 2020

(65) Prior Publication Data
US 2022/0005669 A1 Jan. 6, 2022

Related U.S. Application Data

(60) Provisional application No. 62/770,528, filed on Nov. 21, 2018.

(51) Int. Cl.
H01J 37/304 (2006.01)
G01N 1/28 (2006.01)
(Continued)

(52) U.S. Cl.
CPC ............ *H01J 37/304* (2013.01); *G01N 1/286* (2013.01); *G01N 1/32* (2013.01); *G01N 23/2251* (2013.01); *G01R 31/2898* (2013.01); *H01J 37/31* (2013.01)

(58) Field of Classification Search
CPC .......... H01J 37/31; H01J 37/304; G01N 1/32; G01N 1/286; G01N 23/2251; G01R 31/2898
See application file for complete search history.

(56) References Cited

U.S. PATENT DOCUMENTS 5,926,688 A * 7/1999 Lee .................. H01L 21/31116
257/E21.252
6,201,240 B1 3/2001 Dotan et al.
(Continued)

FOREIGN PATENT DOCUMENTS

CA 2791249 12/2012
CN 103107082 A 5/2013
(Continued)

OTHER PUBLICATIONS

International Search Report and Written Opinion in PCT/CA2019/051661 mailed on Mar. 4, 2020.
(Continued)

Primary Examiner — Sean M Luck
(74) Attorney, Agent, or Firm — Knobbe, Martens, Olson & Bear, LLP

(57) ABSTRACT

Described are various embodiments of an ion beam delayering system and method, topographically enhanced sample produced thereby, and imaging methods and systems related thereto. In one embodiment, a method comprises: identifying at least two materials in an exposed surface of the sample and predetermined operational characteristics of an ion beam mill that correspond with a substantially different ion beam mill removal rate for at least one of the materials;

(Continued)

operating the ion beam mill in accordance with the predetermined operational characteristics to simultaneously remove the materials and introduce or enhance a topography associated with the materials and surface features defined thereby; acquiring surface data; and repeating the operating and acquiring steps for at least one more layer.

17 Claims, 6 Drawing Sheets

(51) Int. Cl.
*G01N 1/32* (2006.01)
*G01N 23/2251* (2018.01)
*G01R 31/28* (2006.01)
*H01J 37/31* (2006.01)

(56) References Cited

U.S. PATENT DOCUMENTS

| | | | |
|---|---|---|---|
| 6,211,527 B1 | 4/2001 | Chandler | |
| 6,288,393 B1 | 9/2001 | Phaneuf et al. | |
| 6,958,248 B1 | 10/2005 | Roy et al. | |
| 7,507,145 B1* | 3/2009 | Zurbuchen | G01N 1/286 451/6 |
| 8,288,737 B1* | 10/2012 | Walck | H01J 37/20 250/311 |
| 8,791,436 B1* | 7/2014 | Pawlowicz | H01J 37/222 250/306 |
| 9,064,811 B2* | 6/2015 | Rue | H01J 37/3056 |
| 2003/0084409 A1* | 5/2003 | Abt | G06F 30/398 716/110 |
| 2005/0285106 A1* | 12/2005 | Kane | G01N 21/68 257/E21.252 |
| 2006/0073618 A1 | 4/2006 | Dulay et al. | |
| 2008/0078750 A1* | 4/2008 | Boguslavsky | H01J 37/147 219/121.41 |
| 2013/0118896 A1 | 5/2013 | Foster et al. | |
| 2015/0136977 A1 | 5/2015 | Buxbaum | |
| 2015/0138532 A1* | 5/2015 | Goodman | G02B 21/32 356/36 |
| 2016/0187419 A1* | 6/2016 | Pawlowicz | G01N 23/2255 324/754.21 |
| 2017/0053778 A1* | 2/2017 | Chen | G01N 1/28 |
| 2019/0074184 A1* | 3/2019 | Denisyuk | H01L 21/3065 |

FOREIGN PATENT DOCUMENTS

| | | |
|---|---|---|
| CN | 106435595 A | 2/2017 |
| CN | 106842001 A | 6/2017 |
| CN | 107075662 A | 8/2017 |
| CN | 107710390 A | 2/2018 |
| EP | 2214200 A3 | 8/2011 |
| TW | 201140139 A | 11/2011 |

OTHER PUBLICATIONS

Extended European Search Report corresponding to EP Patent Application No. EP19887563.5 dated Jun. 30, 2022, 14 pages.
Wei, Han et al. "Focused ion beam (FIB) and its applications", China Materials Progress, Issue 12, 2013, pp. 716-727, 13 pages.
Chinese Search Report in CN Patent Application No. 2019800900716 dated Sep. 4, 2024, in 2 pages.

* cited by examiner

ION BEAM DELAYERING SYSTEM AND METHOD, TOPOGRAPHICALLY ENHANCED DELAYERED SAMPLE PRODUCED THEREBY, AND IMAGING METHODS AND SYSTEMS RELATED THERETO

RELATED APPLICATION

The present application is an International Patent Application which claims benefit of priority to U.S. Provisional Patent Application Ser. No. 62/770,528, filed Nov. 21, 2018 and entitled "ION BEAM DELAYERING SYSTEM AND METHOD, TOPOGRAPHICALLY ENHANCED DELAYERED SAMPLE PRODUCED THEREBY, AND IMAGING METHODS AND SYSTEM RELATED THERETO", the disclosure of which is hereby fully incorporated by reference.

FIELD OF THE DISCLOSURE

The present disclosure relates to delayering a sample and, in particular, to an ion beam delayering system and method, topographically enhanced delayered sample produced thereby, and imaging methods and systems related thereto.

BACKGROUND

The technological revolution of the late 20$^{th}$ and early 21$^{st}$ century has put a premium on competitive corporate intelligence. Companies, especially those involved in high tech, seek to determine what their competitors are putting in their latest products. To this end, integrated circuits, especially high value, cutting edge, microchips are constantly being reverse engineered, analyzed, and dissected to determine what are their internal structures and interconnections.

Currently, the dissection and analysis of integrated circuits involves a painstaking, laborious process. Each layer in a multi-layer microchip is carefully exposed and imaged/photographed. A mosaic of the images is then created and the traces are then laboriously traced to determine which feature is interconnected with which component.

Of the multiple imaging techniques used to make images of each exposed surface, scanning electron microscopy (SEM) is a common one. However, the substantially planar surface of each new layer causes the SEM images to have a small contrast, making it difficult to delineate the location of different materials.

This background information is provided to reveal information believed by the applicant to be of possible relevance. No admission is necessarily intended, nor should be construed, that any of the preceding information constitutes prior art or forms part of the general common knowledge in the relevant art.

SUMMARY

The following presents a simplified summary of the general inventive concept(s) described herein to provide a basic understanding of some aspects of the disclosure. This summary is not an extensive overview of the disclosure. It is not intended to restrict key or critical elements of embodiments of the disclosure or to delineate their scope beyond that which is explicitly or implicitly described by the following description and claims.

A need exists for an ion beam delayering system and method, topographically enhanced delayered integrated circuit sample produced thereby, and imaging methods and systems related thereto, that overcome some of the drawbacks of known techniques, or at least, provides a useful alternative thereto. Some aspects of this disclosure provide examples of such systems and methods where topographical enhancements in otherwise substantially planar delayered sample surfaces can be created using an ion beam mill. Such topographically enhanced ion beam mill delayering processes can, in some embodiments, improve imaging contrast, for example, in scanning electron microscope (SEM) imaging of the delayered sample surface. Accordingly, some embodiments provide for an ion beam delayering process that enhances delayered sample surfaces with topographical features that can lead to improved image contrast and thus, facilitate imaging and, in some embodiments involving the delayering and imaging of integrated circuits, reverse engineering efforts.

In accordance with one aspect, there is provided a method of reverse engineering a sample using an ion beam mill, the method comprising: identifying at least two materials in an exposed surface of the sample and predetermined operational characteristics of the ion beam mill that correspond with a substantially different ion beam mill removal rate for at least one of said materials; operating the ion beam mill in accordance with said predetermined operational characteristics to simultaneously remove said materials, using an ion beam from the ion beam mill, such that said at least one of said materials is milled at said substantially different ion beam removal rate so to introduce or enhance a topography associated with said materials and surface features defined thereby; acquiring surface data from a newly exposed surface of the sample relying, at least in part, on said topography; and repeating said operating and acquiring steps for at least one more layer, said acquired surface data for reverse engineering at least a portion of the sample.

In one embodiment, the predetermined operational characteristics are second predetermined operational characteristics; and the method further comprises, prior to said operating the ion beam mill in accordance with said second predetermined operational characteristics: identifying first predetermined operational characteristics of the ion beam mill that correspond with a substantially identical ion beam mill removal rate for reach of said materials; and operating the ion beam mill in accordance with said first predetermined operational characteristics to simultaneously remove, using said ion beam from the ion beam mill, each of said materials at said substantially identical ion beam mill removal rate so to remove a substantially planar layer of substantially constant thickness from the exposed surface of the sample.

In one embodiment the method further comprises producing hierarchical circuit schematics using said acquired surface data.

In one embodiment, the predetermined operational characteristics are any one or more of the following: angle of sample-to-ion beam direction, ion beam size, beam spread, beam shape, ion type, sample stage temperature, chamber base pressure, chamber cross-over pressure, chamber process pressure, sample stage linear location, sample stage angle, sample stage rotation speed, ion source accelerator voltage, ion source accelerator current, ion source beam voltage, ion source beam current, ion source extractor grid configuration, ion source extractor grid material, ion source RF power, extraction voltage, direct or reflected ion beam, plasma bridge neutralizer (PBN) cathode voltage, PBN emission current, PBN gas flow, ion source type, ion source gas flow rate, chamber background gas type, chamber background gas flow rate, chamber temperature, or sidewall angle.

In one embodiment, the ion beam operates in the presence of a non-reactive gas.

In one embodiment, the ion beam operates in the presence of a reactive gas.

In one embodiment, the predetermined operational characteristics comprise at least one of: type of reactive gas, flow rate of reactive gas, or temperature of reactive gas.

In one embodiment, the ion beam mill is one of a broad ion beam mill or a focused ion beam mill.

In one embodiment, the introduced or enhanced topography has a height in a range of 5 to 15 nm.

In one embodiment, the sample is an integrated circuit (IC).

In one embodiment, the acquiring comprises acquiring a scanning electron microscope (SEM) image of said newly exposed surface, and wherein said SEM image comprises a secondary electron (SE) contribution.

In accordance with another aspect, there is provided a system for reverse engineering a sample using an ion beam mill, the system comprising: an ion beam mill; and a control system in operative communication with said ion beam mill to operate said ion beam mill in accordance with predetermined operational characteristics that correspond with a substantially different ion beam mill removal rate for at least one of said materials identified in an exposed surface of the sample; wherein operation of the ion beam mill in accordance with said predetermined operational characteristics simultaneously removes said materials, using an ion beam from the ion beam mill, such that said at least one of said materials is milled at said substantially different ion beam removal rate so to introduce or enhance a topography associated with said materials and surface features defined thereby.

In one embodiment, the system further comprises: an imaging system for acquiring surface data from a newly exposed surface of the sample relying, at least in part, on said introduced or enhanced topography; wherein said control system is operable to operate said ion beam mill for a subsequent layer to be imaged.

In one embodiment, the acquiring comprises acquiring a scanning electron microscope (SEM) image of said newly exposed surface, and wherein said SEM image comprises a secondary electron (SE) contribution.

In one embodiment, the predetermined operational characteristics are second predetermined operational characteristics; and the control system is operable in accordance with first predetermined operational characteristics that correspond with a substantially identical ion beam mill removal rate for each of said materials so to remove a substantially planar layer of substantially constant thickness from the exposed surface of the sample prior to operating the ion beam mill in accordance with said second predetermined operational characteristics.

In one embodiment, the predetermined operational characteristics are any one or more of the following: angle of sample-to-ion beam direction, ion beam size, beam spread, beam shape, ion type, sample stage temperature, chamber base pressure, chamber cross-over pressure, chamber process pressure, sample stage linear location, sample stage angle, sample stage rotation speed, ion source accelerator voltage, ion source accelerator current, ion source beam voltage, ion source beam current, ion source extractor grid configuration, ion source extractor grid material, ion source RF power, extraction voltage, direct or reflected ion beam, plasma bridge neutralizer (PBN) cathode voltage, PBN emission current, PBN gas flow, ion source type, ion source gas flow rate, chamber background gas type, chamber background gas flow rate, chamber temperature, or sidewall angle.

In one embodiment, the ion beam operates in the presence of a non-reactive gas.

In one embodiment, the ion beam operates in the presence of a reactive gas.

In one embodiment, the predetermined operational characteristics further comprise: type of reactive gas, flow rate of reactive gas, or temperature of reactive gas.

In one embodiment, the ion beam mill is one of a broad ion beam mill or a focused ion beam mill.

In one embodiment, the introduced or enhanced topography has a height in a range of 5 to 15 nm.

In one embodiment, the sample is an integrated circuit (IC).

In accordance with another aspect, there is provided a method of delayering a sample using an ion beam mill for imaging, the method comprising: identifying at least two materials in the sample and predetermined operational characteristics of the ion beam mill that correspond with a substantially different ion beam mill removal rate for at least one of said materials; operating the ion beam mill in accordance with said predetermined operational characteristics to simultaneously remove said materials, using an ion beam from the ion beam mill, such that said at least one of said materials is milled at said substantially different ion beam removal rate so to introduce or enhance a topography associated with said materials and surface features defined thereby; and repeating said operating for subsequent layers.

In one embodiment, the predetermined operational characteristics are second predetermined operational characteristics; and the method further comprises, prior to said operating the ion beam mill in accordance with said second predetermined operational characteristics: identifying first predetermined operational characteristics of the ion beam mill that correspond with a substantially identical ion beam mill removal rate for reach of said materials; and operating the ion beam mill in accordance with said first predetermined operational characteristics to simultaneously remove, using said ion beam from the ion beam mill, each of said materials at said substantially identical ion beam mill removal rate so to remove a substantially planar layer of substantially constant thickness from the sample.

In one embodiment, the method is for delayering a sample for imaging via a scanning electron microscope (SEM).

In one embodiment, the sample is an integrated circuit (IC).

In accordance with another aspect, there is provided a topographically enhanced integrated circuit (IC) sample prepared to have an exposed surface for imaging in accordance with the above-noted methods.

Other aspects, features and/or advantages will become more apparent upon reading of the following non-restrictive description of specific embodiments thereof, given by way of example only with reference to the accompanying drawings.

BRIEF DESCRIPTION OF THE FIGURES

Several embodiments of the present disclosure will be provided, by way of examples only, with reference to the appended drawings, wherein.

Figure 1:
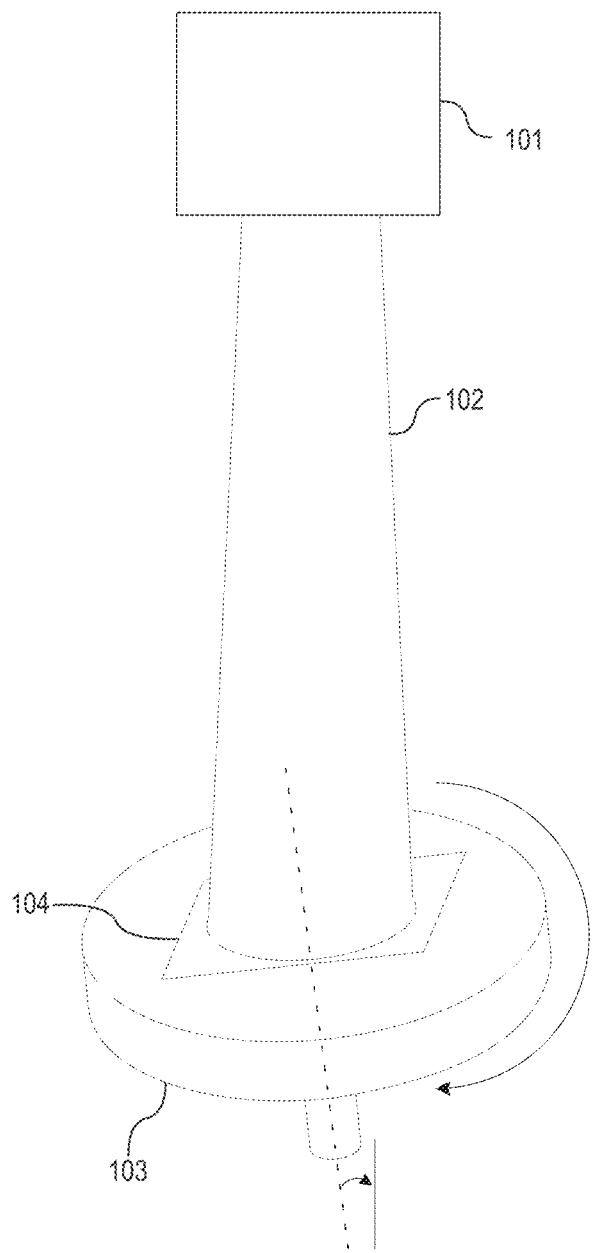
FIG. 1 is a schematic representation of an ion gun, ion beam, sample stage and a sample, in accordance with one embodiment.

Elements in the several figures are illustrated for simplicity and clarity and have not necessarily been drawn to scale. For example, the dimensions of some of the elements in the figures may be emphasized relative to other elements for facilitating understanding of the various presently disclosed embodiments. Also, common, but well-understood elements that are useful or necessary in commercially feasible embodiments are often not depicted in order to facilitate a less obstructed view of these various embodiments of the present disclosure.

DETAILED DESCRIPTION

Various implementations and aspects of the specification will be described with reference to details discussed below. The following description and drawings are illustrative of the specification and are not to be construed as limiting the specification. Numerous specific details are described to provide a thorough understanding of various implementations of the present specification. However, in certain instances, well-known or conventional details are not described in order to provide a concise discussion of implementations of the present specification.

Various apparatuses and processes will be described below to provide examples of implementations of the system disclosed herein. No implementation described below limits any claimed implementation and any claimed implementations may cover processes or apparatuses that differ from those described below. The claimed implementations are not limited to apparatuses or processes having all of the features of any one apparatus or process described below or to features common to multiple or all of the apparatuses or processes described below. It is possible that an apparatus or process described below is not an implementation of any claimed subject matter.

Furthermore, numerous specific details are set forth in order to provide a thorough understanding of the implementations described herein. However, it will be understood by those skilled in the relevant arts that the implementations described herein may be practiced without these specific details. In other instances, well-known methods, procedures and components have not been described in detail so as not to obscure the implementations described herein.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" may be construed as X only, Y only, Z only, or any combination of two or more items X, Y, and Z (e.g., XYZ, XY, YZ, ZZ, and the like). Similar logic may be applied for two or more items in any occurrence of "at least one . . . " and "one or more . . . " language.

The systems and methods described herein provide, in accordance with different embodiments, different examples in which a method, system and computer program product are used to introduce or enhance the topography of an otherwise substantially planar surface of a sample being delayered in an ion beam mill to improve downstream imaging. For example, in one particular embodiment, such topographical enhancements may result in improved imaging contrast, sharpness, accuracy and/or other such imaging characteristics achieved using downstream imaging techniques, such as scanning electron microscopy (SEM) imaging, or images rendered via other such imaging techniques. In one example, the introduced or enhanced topography is achieved by adjusting one or more operating parameters of the ion beam mill and selectively removing at least one material at a different rate than the others so to create or enhance edges, ridges and/or topographical steps between them that will provide improved imaging contrast, for example.

As used herein, the terms and concepts of introducing or enhancing topographical features in a given sample will be used and described interchangeably in that the techniques described herein may equally be applied to introduce topographical features where such features did not previously exist, and/or to enhance previously existing topographical features. Accordingly, where reference is made to the introduction or enhancement of topographical features on a sample surface, such introduction or enhancement should be equally interpreted to refer to the introduction of newly created topographical features and/or to the enhancement of such features.

According to some embodiments, reverse engineering of the circuitry of an integrated circuit (IC) may comprise delayering the sample with an ion beam mill layer by layer and exposing the circuitry or circuit connections on the surface of each layer. Upon delayering the device, pictures, images or other representation (e.g. circuit schematic model based on data representative of detected surface features) may be taken of each layer, thereby, capturing the circuitry or circuit connections on the surface of each layer. By piecing together the pictures, images, or other representations of the different layers, using appropriate software tools, circuit connections between the various components that may be inherent within a device, both across and between layers, can be produced. The process may be repeated for various devices within a larger device and a hierarchical schematic of the circuit connections of the various devices within the larger device may be developed. Proprietary software tools may also be used to produce hierarchical circuit schematics. Such circuit schematics may be useful in identifying evidence of use of claim elements in the target device being delayered. According to some embodiments, delayering may be performed for, but is not limited to, failure analysis (defect identification), circuit edit, sample/ device characteristics measurement, verification of design, and counterfeit detection. While the following examples contemplate applications within the context of IC delayering and reverse engineering, specifically, other applications may also apply, for example, such as in the delayering, imaging and/or analysis of biological or geological samples, for example, as will be readily appreciated by the skilled artisan.

In some embodiments, the imaging system or method used to acquire pictures or images of each exposed layer in a given sample is a scanning electron microscopy (SEM), wherein electrons ejected from the surface can be used to create an image by using an electron detector. Depending on the sample's materials and other factors, more or less electrons might be emitted. The image can therefore be used to identify regions of the sample with different characteristics. As an example, metal circuitry may emit a different number of electrons than dielectric areas and this may cause metal circuitry to appear differently than dielectric areas in the image. Similar imaging considerations to contract different materials or material properties in biological, geological and/or other sample types may also be considered, as noted above.

The methods and systems described herein provide the means of improving the contrast, or other such imaging characteristics, in such SEM or other layer images by introducing topographical features into the surface of a delayered sample. As noted above, by sample, it is generally meant a composition of one or more materials. A sample may also refer to, but is not limited to: a semiconductor device, Integrated Circuit, a layer of metals and dielectrics of any thickness, one or more materials in an area of any size, optical devices, electronic devices, or any combinations thereof, as well as samples in other fields of analysis such as in biological or geological samples, to name a few examples. A worker skilled in the art would readily understand the meaning of a sample for the purposes of the subject matter disclosed herein. For simplicity, but without loss of generality, the following description will focus on the processing of semiconductor devices and/or integrated circuits within the context of reverse engineering applications.

Generally, delayering a sample in an ion beam mill involves an ion beam incident and impinging upon a surface of the sample whereby interaction of the ion beam with the surface results in removal of material from the surface at a rate. For the purposes of the subject matter disclosed herein, the terms rate, material removal rate, removal rate, delayering rate, milling rate, etch or etching rate, material rate, and rate of removal may all be used interchangeably.

According to some embodiments, a layer of a sample or portions thereof may be made up of one or more materials. Removal of a layer may comprise, partly or wholly, removing one or more materials resident within. A layer may be of any thickness. One or more materials present in a sample may be any one or more materials from the chemical periodic table. Each layer may be made up of a mixture of materials such as, but is not limited to, metals and dielectrics in varying shapes and structures. There are a wide number of ion beam mills readily available in the market as would be known to a worker skilled in the art. For the purposes of this disclosure, ion beam mill, mill and ion mill may all be used interchangeably. Similarly, Broad Ion Beam mill, BIB mill and Broad Beam Ion mill may all be used interchangeably.

According to some embodiments, the ion mill and its various components may be collectively referred to as the ion mill. The ion mill may comprise an end point detection unit as one of its components. The end point detection unit may be in operative connection with the ion mill. The end point detection unit may be capable of detecting or measuring one or more changes in the sample as one or more materials are being removed. For example, the detection unit may detect or measure the existence and/or quantity of different materials.

An ion beam mill may consist of one or more ion beam sources. According to some embodiments, the ion mill consists of one or more large diameter gridded ion beam source and a, variable angle, cooled sample stage that can be tilted and rotated. A sample stage may be housed in a vacuum chamber. Various gas injection systems may deliver different process gasses, while a plasma bridge neutralizer may be used to neutralize the ion beam. Vacuum gauges, a load-lock, vacuum pumps, one or more control panels, and one or more processors may also be associated with the ion mill. The ion mill may also comprise elements to introduce various gasses and one or more elements to control the sample stage. Furthermore, one or more ion beam sources may be associated with apertures and electrostatic lenses. The ion mill may consist of one or more actuators to actuate one or more elements of the ion mill. The ion mill may comprise one or more controllers or a control system comprising one or more processors to control the one or more ion mill operating characteristics or parameters. It is to be understood that the operation of an ion mill and the various fundamental components of an ion mill would be readily known to a worker skilled in the art. FIG. 1 shows an illustrative example of an ion source 101 from which an ion beam 102 is produced. The ion beam impinges on a sample 104, which is placed on a sample stage 103.

As mentioned above, the ion mill may comprise an imaging system as one of its components. The imaging system may be in operative connection with the ion mill. A worker skilled in the art would readily know various end point detection units and imaging systems. Furthermore, the ion mill together with a control system may form a system to delayer a sample.

Scanning Electron Microscopy (SEM):

In some embodiments, as discussed above, the imaging system is a scanning electron microscope (SEM). In general, a SEM imaging device comprises a focused beam of electrons that is scanned over the surface to be imaged. These electrons interact with the materials in the surface and returning or ejected electrons are thus measured. With such a system, two types of imaging signal are usually detected; the backscattered electrons (BSE) and the secondary electron (SE). In either mode, the important properties of the image, such as the spatial resolution and the level of signal contrast, are dependent on the physics of the interaction between the incident electron beam and the solid surface.

BSE consist of electrons originating from the electron beam that are reflected or backscattered out of the sample interaction volume by elastic scattering interactions with sample atoms. Thus, BSE leave the sample with energies which are a significant fraction of that of the incident beam. BSE imaging generally relies on the fact that the backscattering coefficient varies monotonically with the atomic number (Z) of the target atoms. Thus, BSE images show features of high average Z appear brighter than those of low average Z ("Z-contrast") and provide useful information about the material composition of the surface. Moreover, BSE generally penetrate the sample surface at a greater depth. Thus, the presence of contamination (e.g., a thin oxide film) on the surface will not greatly affect the measured backscatter yield, and hence the image deduced from it. However, when imaging an area containing two materials having similar Z values (i.e. Aluminum and Silicon Dioxide), BSE images will have a low contrast difference between the two materials, making the position of the interface between the two materials difficult to distinguish.

In contrast to BSE, secondary electrons (SE) originate from the surface or the near-surface regions of the sample. SE imaging is one of the most widely used mode of operation of the SEM. However, despite its advantages, such as the wide variety of signal information available and the ease with which the secondaries can be collected, the secondary image may suffer from being poorly characterized (i.e. higher noise) in so far as the electrons which are collected by the detector can come from a variety of sources, classified as SE1 electrons, SE2 electrons and SE3 electrons. SE1 electrons are the secondaries produced directly by the incident beam while SE2 electrons are those generated by exiting backscattered electrons. The SE3 electrons are produced as the result of backscattered electrons hitting chamber walls or the lens system. Of these signals, only SE1 or SE2 carries information about the sample, the other contributes only to the background intensity and to the statistical noise of the image. Imaging with secondary electrons generally provides information about morphology and surface topography.

Figure 2:
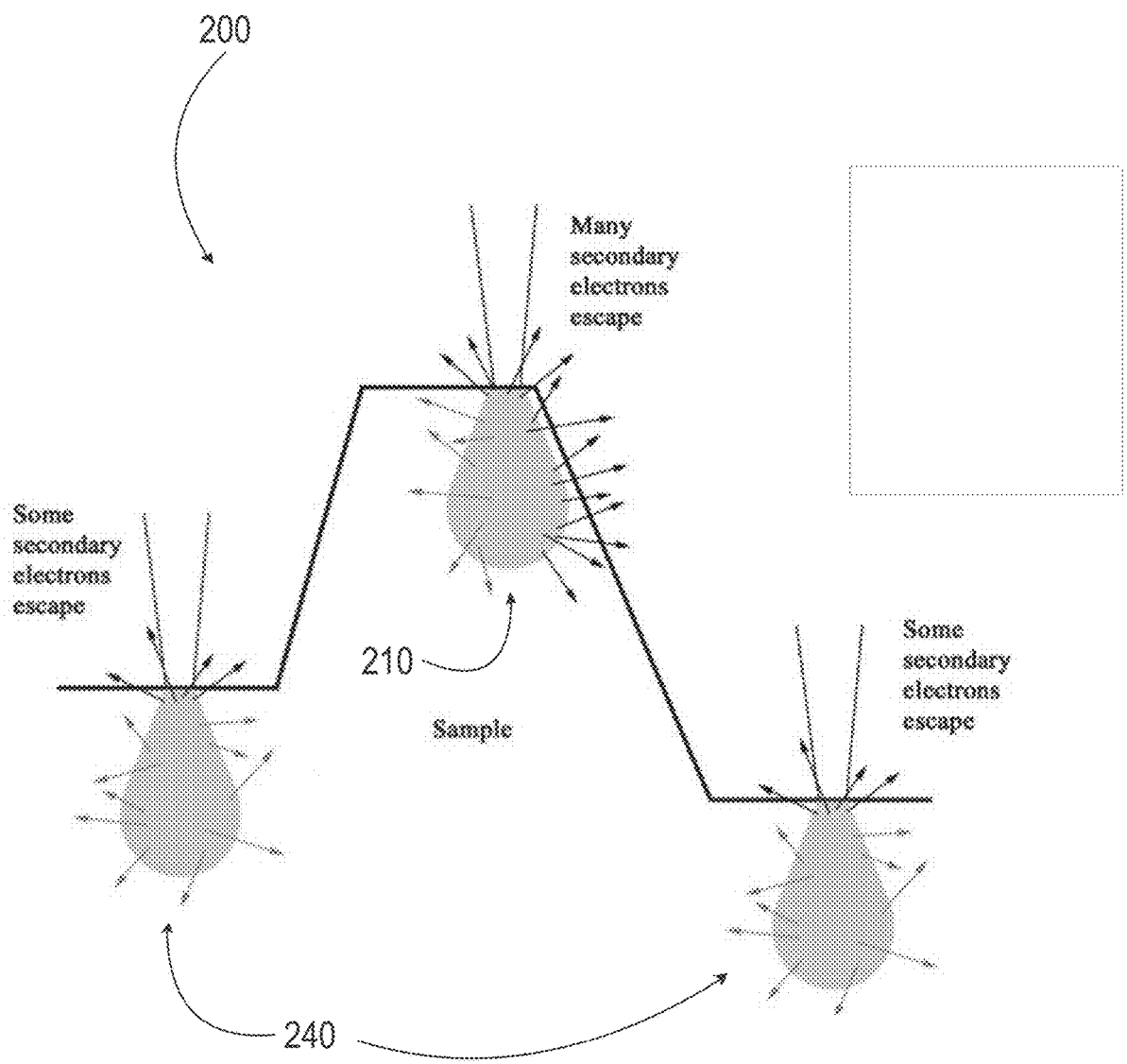
FIG. 2 is a schematic representation of a cross-section of a sample surface delayered to have a topographical enhancement, and secondary electrons generated therefrom, in accordance with one embodiment.

With reference to FIG. 2, and in accordance with one exemplary embodiment, a schematic cross-section of a sample surface and secondary electrons generated therefrom, generally referred to using the numeral 200, will now be described. In general, SE images display higher contrast from surface topographic details (topographical contrast) because changes in the effective angle of incidence between the electron/ion beam and the sample surface alter the average depth of secondary production and hence the probability of escape. This is seen in FIG. 2 wherein electrons emitted from the edge area 210 produces more secondary electrons than the flat or planar surfaces 240. Similarly, SE images of surface steps, and edges, will appear to be outlined by a bright line due to the enhanced emission of secondary electrons from edges and peaks within the sample. The resultant "edge effects" is often an asset in defining structural features that might otherwise be too low in contrast to be seen.

In some embodiments, a SE2 image of an enhanced surface may be combined with a BSE image of the same surface to produce an improved SEM image of the surface. Such an image may combine atomic number contrast (Z-contrast) of the BSE contribution with the topographical contrast of the SE contribution.

A worker skilled in the art would readily understand SEM, how to acquire different types of signals therefrom and how to use those signals to generate surface images.

Figure 3A:
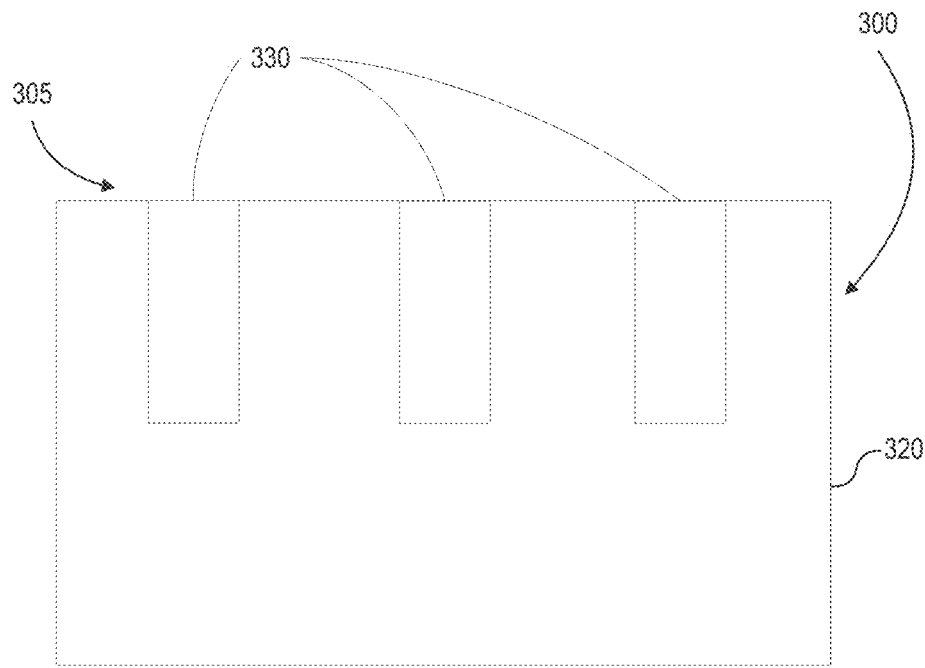
FIGS. 3A and 3B are schematic cross-sectional views of an integrated circuit sample surface, before and after being topographically enhanced, respectively, in accordance to one embodiment.
Figure 3B:
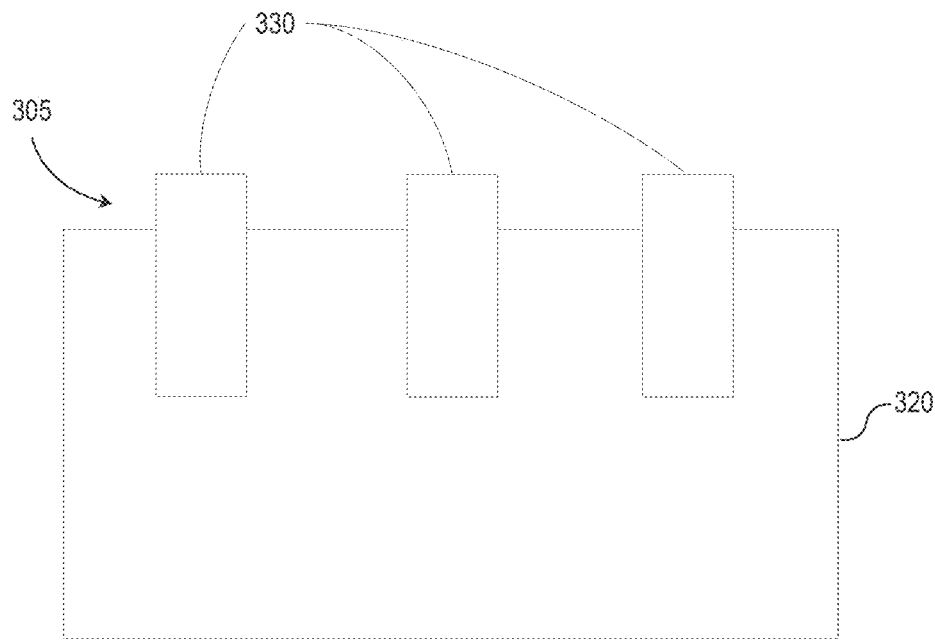

With reference to FIGS. 3A and 3B, and in accordance with one exemplary embodiment, schematic cross-sectional views of an integrated circuit sample surface, before and after being topographically enhanced respectively and generally referred to using the numeral 300, will now be described. In FIG. 3A, the surface 305 of sample 300 is initially planar or flat, for instance due to a prior delayering operation. Sample 300 comprises two types of material, a material 320 and a material 330. In some embodiments, materials 320 and 330 may have similar Z values (i.e. $SiO_2$ and Al), resulting in a reduced contrast between the two materials in a scanning electron microscopy (SEM) image of surface 305 (BSE because of the similar Z number and SE because of the planar surface). Thus, to improve a SEM image of such as delayered sample, the SE contrast may be improved by adjusting the ion mill's operating characteristics to selectively remove a small amount of one material (Material 320) at a higher rate than the other material (material 330), as shown in FIG. 3B. This selective milling is only done to create a few nm (e.g. approx. 5-10 or 15 nm) of topography, as to not expose the next layer in a multi-layered IC sample. Indeed, in such systems, subsequent layers are generally separated by 50-100 nm of material. As noted above, the shallow selective milling on surface 305 will have the effect of enhancing a SE image thereof by introducing some topographical features (e.g., edges) at the interface between the two materials and thus increasing the edge effect contribution in a SE image. As a result, a SE image of surface 305 will produce a clearer image of the interface between the two materials. As will be appreciated by the skilled artisan, however, greater topographical features may be introduced or enhanced using the herein described approach, for example, in the order of 25 nm, 50 nm, 75 nm, 100 nm or even higher as may be reasonable or applicable for a given application.

In the illustrated example, the topography-enhancing milling is implemented upon the delayered substantially flat surface of interest, whereby one surface material is then selectively delayered at a higher rate than the other(s) to produce the topographical features of interest. This may be achieved, for example, by first invoking an ion beam delayering process or sequence whereby a layer of substantially constant thickness is removed from the entire surface area of the sample (or portion of interest thereof); topographical enhancements may then be induced as a final sample surface preparation step for imaging. In yet other examples, slightly offset ion beam milling rates may be selected or sequenced such that the delayering and topographical surface enhancement steps are implemented concurrently, whereby a particular sample layer is removed while concurrently inducing the desired topographical features. Other milling sequences may also be considered, without departing from the general scope and nature of the present disclosure.

In some embodiments, the topographical features introduced or enhanced on the surface as described above may also be used to improve contrast with other imaging systems or methods, such as scanning probe microscopy (SPM) or atomic force microscopy (AFM), to name a few examples.

As noted above, in some embodiments, the topographical features are introduced on an initially flat surface by adjusting one or more of the operating characteristics of the ion mill. The one or more ion beam mill operating characteristics may be associated with a predetermined rate at which a material may be removed. Delayering a sample may be achieved by configuring the ion mill to remove one or more materials from the sample at their respective predetermined rates. The association of rates of removal to sets of ion mill operating characteristics may be obtained experimentally through trial and error or via simulation methods. The rates of removal and their associated sets of ion mill operating characteristics may be logged or stored for future manipulation of the ion mill in any storage medium such as a database, memory device, computing storage device or any storage medium as would be known to a worker skilled in the art.

In general, delayering may be set to take place for a certain time; after which, the sample may be removed from the ion beam mill, analyzed, and further delayered as necessary, until the desired level of delayering is achieved.

According to some embodiments, delayering may be set to take place until a certain thickness of the sample is delayered. Delayering may also involve removal of substantially parallel homogenous or non-homogenous layers. The surface area of the layer of the sample to be delayered may be large. Furthermore, the surface area of the layer of the sample to be delayered may be in the range of 5 to 20 square centimeters.

According to some embodiments, a Secondary Ion Mass Spectroscopy (SIMS) end point detection unit may be used to help with accurately controlling milling rates. A worker skilled in the art would readily understand SIMS and its usage as an end point detection element. Visual detection, chemical detection tools, other mass spectroscopy tools or any end point detection system as would be readily known to a worker skilled in the art may also be used as an end point detection unit/element to accurately control milling rates Selectivity:

The operation of an ion beam mill, as mentioned above, may depend on one or more ion beam mill operating characteristics or parameters. The operation of an ion beam mill and the results of such operation may vary based on the adjustments made to one or more ion beam mill operating characteristics.

According to some embodiments, the one or more ion mill operating characteristics or parameters may include, but are not limited to, ion beam direction, ion beam size, sample cooling, chamber base pressure, chamber cross-over pressure, chamber process pressure, load lock base pressure, load lock cross-over pressure, sample stage linear location, sample stage angle, sample stage rotation speed, sample stage temperature, ion source accelerator voltage, ion source accelerator current, ion source beam voltage, ion source beam current, ion source extractor grid configuration, ion source extractor grid material, plasma bridge neutralizer (PBN) cathode voltage, plasma bridge neutralizer emission current, PBN gas flow, ion source gas flows and types, background gas flows and types, angle of sample-to-ion gun, any chamber condition, and sidewall angle or any combinations thereof or any ion mill characteristic or parameter that may be adjusted as would be known to a worker skilled in the art. For the purposes of the subject matter disclosed herein, ion mill operating characteristics, ion mill operating parameters, characteristics, and parameters may be used interchangeably. Similarly, sample stage angle and sample angle may be used interchangeably. Beam angle, sample to beam angle or sample stage to beam angle would all mean the angle at which the beam impinges on the sample.

According to some embodiments, adjusting the one or more ion mill operating characteristics may provide different material removal rates. For example, for a given set of ion mill operating characteristics the rate of removal for a particular material in a particular sample or different samples may be the same. As another example, a given material in a given sample may have different rates of removal for different sets of ion mill operating characteristics. As a further example, a given material in different samples may have different rates of removal for a given set of ion mill operating characteristics. As yet another example, a given material in different samples may have different rates of removal for different sets of ion mill operating characteristics. Various permutations and combinations of the one or more ion mill operating characteristics may provide different rates of removal for a given material in the same sample or in different samples. A set of ion mill operating characteristics or parameters may entail a set of values corresponding to the one or more ion mill operating characteristics or parameters associated to the rate at which a material may be removed.

Accordingly, operating an ion beam mill under carefully selected conditions may result in the removal of a inhomogeneous layer of substantially constant thickness, whereas operating under carefully selected alternate conditions may result in the formation of a selectively uneven surface, which, as noted above, could be deliberately selected and controlled so to introduce topographical surface enhancements to an otherwise substantially flat sample surface to enhance downstream imaging characteristics.

According to some embodiments, the ion source radio frequency power may be forward or reflected. The ion source extractor grid configuration may include selecting the appropriate material, size, number and grid pattern of the extractor grids. The extractor grid configuration may be set to produce focused, collimated or divergent beam. According to some embodiments the ion source gas flows and types may be multiple. The ion source gas may be inert or reactive. Furthermore, the background gas flows and types may be multiple. The background gas may be reactive. In addition, the angle of sample-to-ion gun may be adjusted by moving either the sample stage or ion gun or both. The angle of sample-to-ion gun may be adjusted to select optimum etching/milling rates. According to some embodiments, the ion source extractor grid material may be graphite, molybdenum or any other material as would be readily understood by a worker skilled in the art.

According to some embodiments, the rate may be predetermined. Predetermined rates may be obtained through trial and error via experiments or via simulation methods. For a given material, the predetermined rate may be obtained by setting the ion beam mill characteristics to a certain set of values and obtaining the corresponding rate at which the material may be removed.

For example, a first predetermined rate for a particular material may be obtained by placing the material inside the ion mill and adjusting the operating characteristics to a certain set of values and logging the rate at which the material is removed. A second predetermined rate of removal for the same material may be obtained by adjusting the ion mill operating parameters to a second set of values. Furthermore, various sets of ion mill operating characteristics, for a given material, may be set and the corresponding rates determined. In addition, various combinations of ion mill operating characteristics may be set and experiments performed to obtain removal rates of one or more materials in the same or different samples. Rates determined as such may then be classified as predetermined rates. Predetermined rates may also be obtained via simulation methods. In aspects, predetermined rates of materials may be obtained by introducing reactive species and mixing them with matter ejected from the ion beam source. It is to be understood that any method of obtaining or measuring material removal rates would fall under the purview of this disclosure.

Predetermined rates for different materials may be associated with their respective sets of ion mill operating characteristics. The predetermined rates for different materials and their associated respective sets of ion mill operating characteristics may be logged manually or stored in any medium and used for future manipulation of the ion mill. According to some embodiments, each set of ion mill operating characteristics may comprise one or more ion mill operating characteristics. The values for the one or more ion mill operating characteristics within each set may be the values that would have been set during the trial and error or simulation process. In addition, as these values may be set during the trial and error or simulation process, they may also be regarded as predetermined values. Furthermore, the medium used for storage of sets of ion mill operating characteristics and associated respective predetermined rates is a computer drive, electronic device, optical device, or any storage medium that would be readily known to a worker skilled in the art. The storage medium may be part of the ion mill and the storage medium may be part of a system comprising the ion mill and a control system.

According to some embodiments, selectively removing may be regarded as adjusting the one or more ion mill operating characteristics to remove a material, at a certain predetermined rate, relative to removal of another material at a different predetermined rate. As well, selectively removing may be regarded as removing a specific material. Non-selectively removing may be regarded as operating the ion mill with a certain set of operating parameters without having control over the rates of removal of the one or more materials. This may lead to non-uniform or uneven underlying surface. In contrast, selective removal at distinct predetermined removal rates for distinct sample materials may result in the deliberate formation of material-specific topographical enhancements that can be used to advantage in a downstream imaging process.

According to some embodiments, the ion mill operating characteristics may be set such that for a given time period, the predetermined rate of removal of a first material is higher than that of a second material. After which, the ion mill characteristics may be adjusted and set to another set of values, for a time period during which the predetermined rate of removal of the second material is higher than that of the first material. It may also be possible for the predetermined rates of all materials to be removed to be substantially same. For the purposes of this disclosure, period of time and time period may be used interchangeably.

According to some embodiments, all but one of the one or more ion mill operating parameters may be set. One of the one or more ion mill operating parameters may be variable and the rate of removal of one or more materials for various values of the variable ion mill operating parameter may be obtained experimentally or via simulation.

Figure 4:
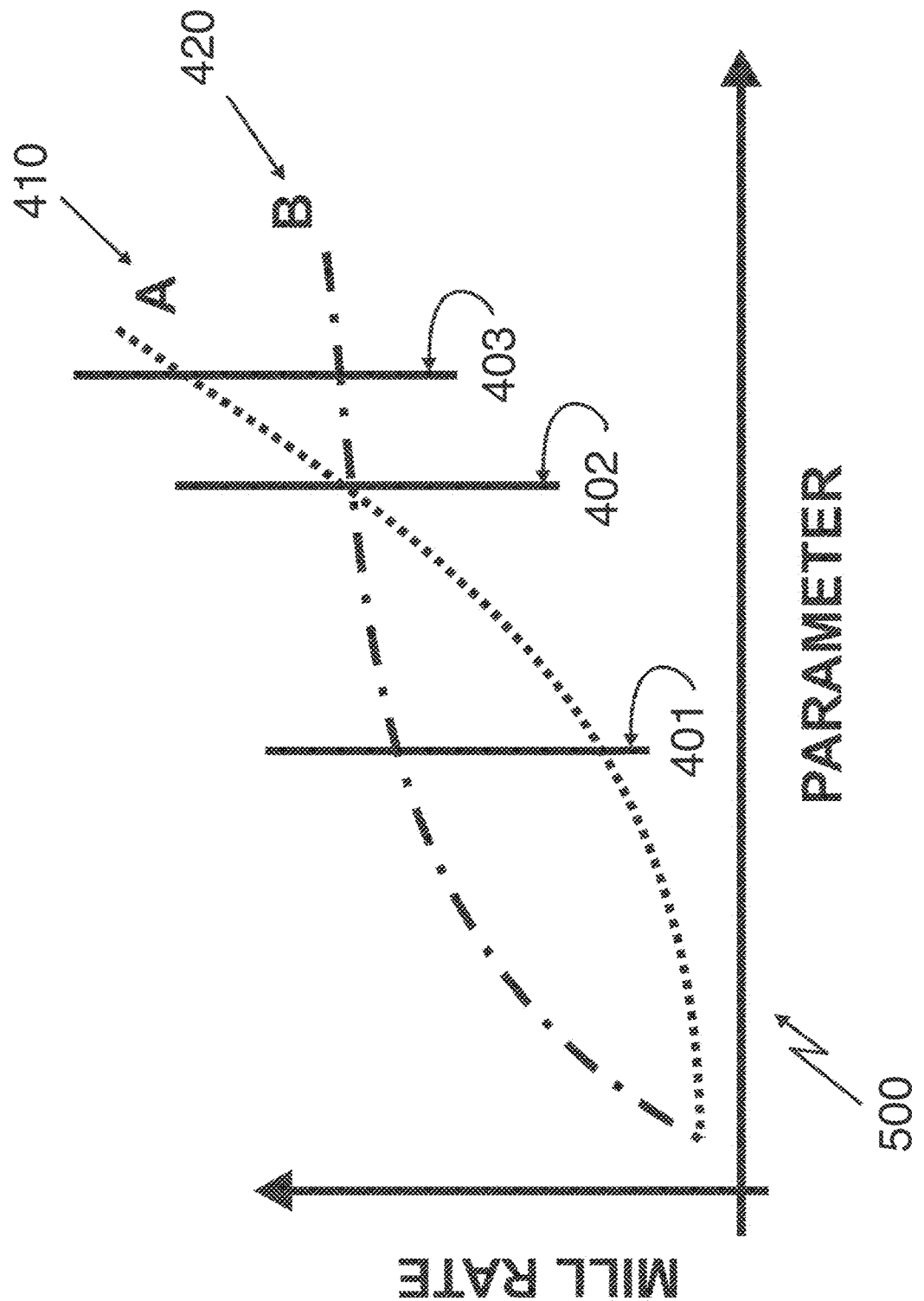
FIG. 4 is a graph representing material mill rate versus ion mill operating parameters of two materials A and B, in accordance with one embodiment.

The results obtained and their respective ion mill operating parameters set to obtain them may be associated with each other and stored in a storage medium. A worker skilled in the art would readily understand the kind of storage medium needed. Based on the results obtained, a graph 400 may be plotted as shown in FIG. 4. The plotted graph shows mill rates or removal rates for two materials, A 410 and B 420, as a function of an ion mill operating parameter. At 401, the rate of removal for B is higher than the rate of removal for A. At 402, the rate of removal is substantially equal for both A and B and at 403, the rate of removal of A is higher than the rate of removal for B.

According to some embodiments, when encountered with a sample, for delayering, comprising materials A and B, the delayering may be set to take place with the one or more ion mill operating parameters set such that both material A and material B may be removed simultaneously. Simultaneous removal of A and B may be obtained when the one or more ion mill operating parameters are set such that the rates of removal for both A and B are substantially equal as seen at the intersection point 402. For example, the one or more ion mill operating parameters may be set such that material B is removed at a higher rate than material A. Thus, selective removal of materials from a sample may be achieved. In such a delayering process, all but one of the ion mill operating parameters will stay constant for any rate of removal for the two materials A and B. The one ion mill operating parameter that is variable may be set to the respective value as required. For example, for delayering at 402, the required parameter value may be the parameter value corresponding to the intersection point. This would allow for both materials, A and B, to be removed at the same rate. In doing so, delayering at a substantially identical rate may be possible for all sample materials, resulting in the removal of a layer of substantially constant thickness. In the example noted above, this could take place in a first step for delayering the sample to a subsequent layer of interest from a previous layer of interest. Operating conditions may then be adjusted, for example, to favour milling of one of materials A or B (i.e. to steer respective milling rates away from intersection point 402) to produce the topographical surface enhancements of interest. Alternatively, operating conditions may be deliberately set to be slightly offset from the intersection point 402 at the outset so to concurrently delayer the sample while progressively introducing the topographical enhancements of interest.

According to some embodiments, one or more ion mill operating characteristics may be set and the rate of removal as a function of sample stage angle, which may also be regarded as an operating parameter of the ion mill, may be determined. The determination of the rates of one or more materials may be experimental, or via simulation methods. Furthermore, any other ion mill operating characteristic may replace the sample stage angle.

Figure 5:
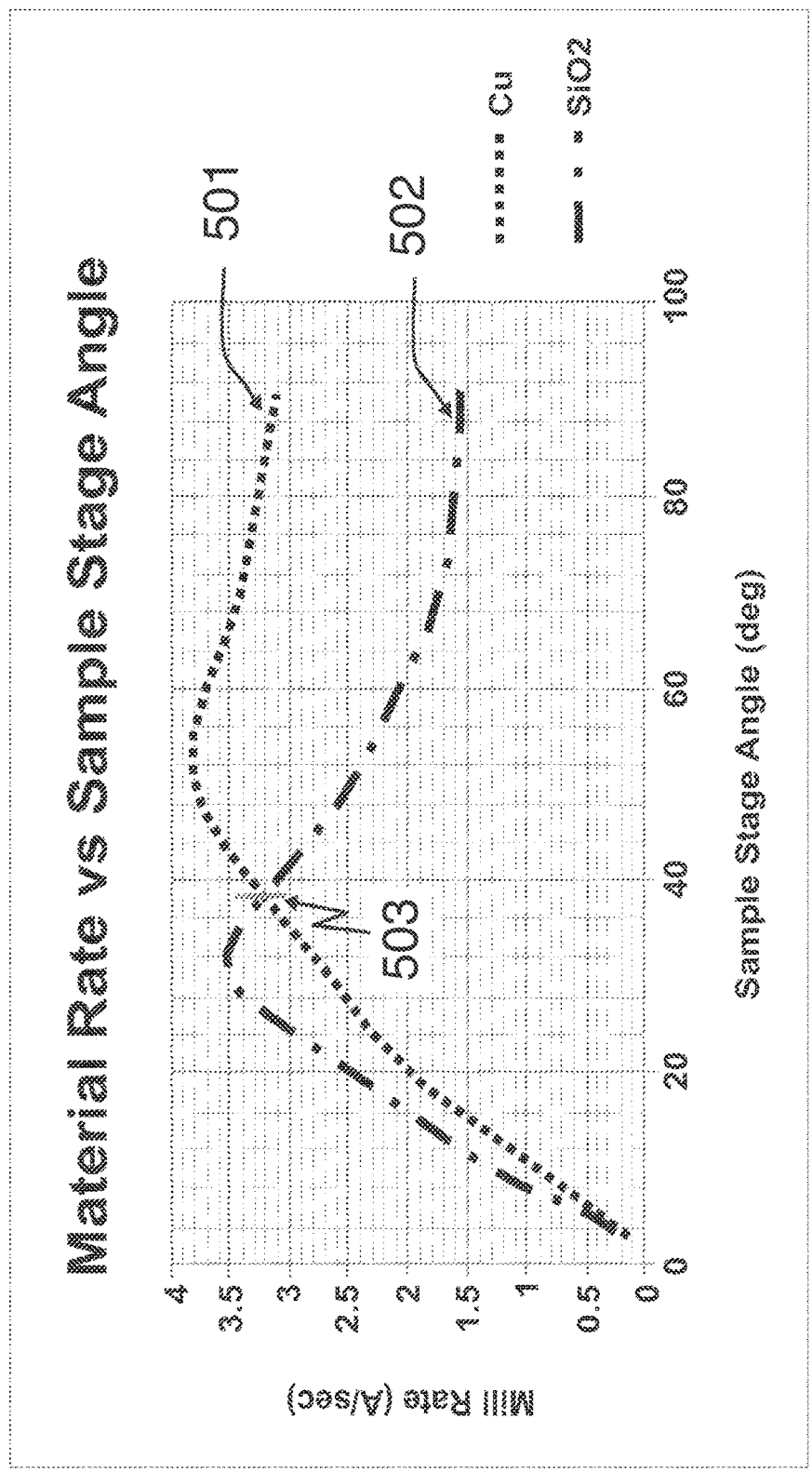
FIG. 5 is a graph representing material mill rate versus sample stage angle for Copper (Cu) and Silicon Dioxide ($SiO_2$), in accordance with one embodiment.

For example, the rates determined may be for two materials and the two materials may be Cu and SiO2. The set of ion mill operating characteristics that relate to the rates of removal for Cu and SiO2 for various sample stage angles may be associated with one another, respectively, and stored in any storage medium. Using the predetermined rates and the associated ion mill operating characteristics from the storage medium, a graph 500 comprising the predetermined rates as a function of sample stage angles may be plotted for both Cu 501 and SiO2 502 as shown in FIG. 5. It is to be understood that delayering may be carried out without explicitly plotting a graph. For example, a control system that may comprise one or more processors may be able to control the ion mill to delayer a sample without explicitly plotting a graph.

Referring again to the plotted graph 500 of FIG. 5, there may be an intersection point 503 obtained at which the rate of removal for both Cu and SiO2 are substantially the same for a particular sample stage angle. The intersection point may provide the predetermined rate of removal for both Cu and SiO2. For example, if a layer comprising Cu and SiO2 is to be delayered, then the ion mill operating characteristics may be adjusted in accordance with the stored values, which may relate to the point of intersection, to remove both Cu and SiO2 at the respective predetermined rate that would relate to the point of intersection for a period of time, thus resulting in a substantially flat delayered surface. As noted above, the sample stage could then be slightly adjusted away from the intersection point 503 to produce the topographical enhancements of interest.

Figure 6:
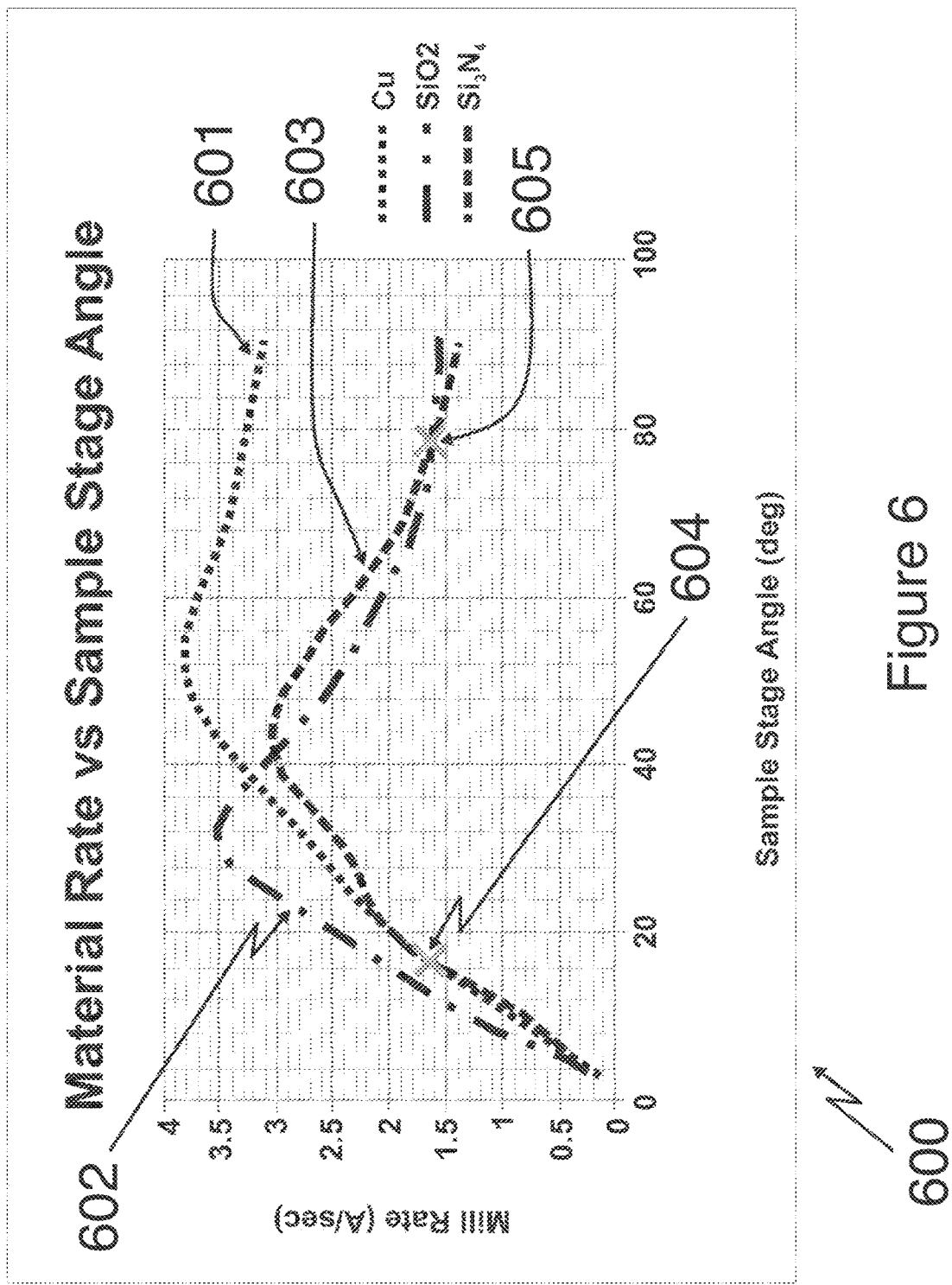
FIG. 6 is a graph representing material mill rate versus sample stage angle for Copper (Cu), Silicon Dioxide ($SiO_2$) and Silicon Nitride ($Si_3N_4$), in accordance with one embodiment.

As another example, the rates determined may be for three materials, which may be Cu, SiO2 and Si3N4. The set of ion mill operating characteristics that relate to the rates of removal for Cu, SiO2 and Si3N4 for various sample stage angles may be associated with one another, respectively, and stored in any storage medium as would be known to a worker skilled in the art. Using the predetermined rates and the associated ion mill operating characteristics from the storage medium, a graph 600 comprising the predetermined rates as a function of sample stage angles may be plotted for Cu 601, $SiO_2$ 602, and $Si_3N_4$ 603, as shown in FIG. 6. From the plotted graph, an intersection point 604 can obtained at which the rate of removal for both Cu and $Si_3N_4$ are substantially the same for a particular sample stage angle.

There may also be an intersection point 605, between SiO$_2$ and Si$_3$N$_4$, at which the rate of removal for both SiO$_2$ and Si$_3$N$_4$ may be substantially the same for a particular sample stage angle. For example, if a sample comprising a layer of Cu, SiO$_2$ and Si$_3$N$_4$ is to be delayered, then the ion mill operating characteristics may be adjusted, in accordance with the stored values that relate to the point of intersection for Cu and Si$_3$N$_4$, to selectively remove both Cu and Si$_3$N$_4$ at the respective predetermined rate, which would relate to the point of intersection for Cu and Si$_3$N$_4$, for a period of time. After which, the ion mill operating characteristics may be adjusted, in accordance with the stored values that relate to the point of intersection for SiO$_2$ and Si$_3$N$_4$, to selectively remove both SiO$_2$ and Si$_3$N$_4$ at the respective predetermined rate, which would relate to the point of intersection for SiO$_2$ and Si$_3$N$_4$, for a period of time, thus, leaving a substantially uniform underlying surface, upon which to then selectively introduce topographical enhancements of interest. The only ion mill operating parameter that may require change between the intersection points 604 and 605 might be the sample stage angle.

According to some embodiments, there may not be any intersection points between any of the materials that are to be removed. For instance, similar to the above example, there may be a layer that comprises three materials, A, B and C, to be delayered. After obtaining the predetermined rates and plotting a graph, similar to FIG. 6, it may be found that there may not be any intersection points. In such an instance, the ion mill operating characteristics may be set such that two of the three materials with lower predetermined rates may be selectively removed first for a period of time and subsequently the ion mill operating characteristics may be adjusted to selectively remove the third material with a higher predetermined rate for another period of time. The time period required for the removal of the first two materials may be higher than the time period required for the removal of the third material.

As an example, referring to the table below:

| | Predetermined Rate of removal - Material A (A/sec) | Predetermined Rate of removal - Material B (A/sec) | Predetermined Rate of removal - Material C (A/sec) |
|---|---|---|---|
| Ion mill operating Characteristics - Set I | 0.3 | 0.1 | 0.3 |
| Ion mill operating Characteristics - Set II | 0.1 | 0.3 | 0.1 |
| Ion mill operating Characteristics - Set III | 0.4 | 0.4 | 0.4 |

For a given ion mill operating characteristics—set III the predetermined rate at which all three materials A, B, and C may be removed is 0.4 A/sec. The ion mill operating characteristics may be adjusted to reflect the ion mill operating characteristics—set III for a certain period of time, wherein materials A, B, and C are all simultaneously removed. The underlying surface, after delayering the three materials A, B, and C simultaneously, would be substantially uniform. Similarly, the ion mill operating characteristics may be set to reflect the ion mill operating characteristics—set I for a period of time, for example t1, wherein materials A and C are removed at 0.3 A/sec and material B is removed at 0.1 A/sec. After which, the ion mill operating characteristics may be set to reflect the ion mill operating characteristics—set II for a period of time, for example t2, wherein materials A and C are removed at 0.1 A/sec and material B is removed at 0.3 A/sec. At t=t1+t2, all three materials A, B and C would have been removed equally thereby leaving the underlying surface substantially uniform. Using any of these approaches, selectively adjusting operating characteristics to favour one particular material could then used to introduce the topographical enhancements of interest.

According to some embodiments, one or more operating characteristics or parameters may be adjusted to selectively remove a side-wall of a sample, wherein the side-wall comprises one or more materials. Predetermined rates, of one or more materials, and their respective associated ion mill operating characteristics may be relied upon to adjust the ion mill to selectively remove the one or more materials at respective predetermined rates from the side-wall of the sample. In addition, one or more materials surrounding a structure, in a sample, may be selectively removed at their respective predetermined rates by adjusting the one or more ion mill operating characteristics or parameters.

According to some embodiments, selective removal of material may take place until a certain thickness is removed. In aspects, sets of ion mill operating characteristics may be executed in a sequential manner to remove one or more materials. The time of execution for each set of ion mill operating characteristics may be random or may be set to be a certain value as may be determined previously through trial and error via experiments or simulation methods. In addition, the time of execution for each set of ion mill operating characteristics may be adjusted in real time by a control system. The control system may use a feedback mechanism to determine the optimal time of execution for each set of ion mill operating characteristics. The time of execution for each set of ion mill operating characteristics may be determined based on the thickness, of the one or more materials, to be removed.

Control System:

According to some embodiments, a system may comprise an ion mill in operative communication with a control system or one or more controllers. The control system may control the ion mill components individually or as a whole. The control system may comprise one or more processors with the appropriate software loaded into them to execute control. A worker skilled in the art would readily understand the necessary processors and associated software. The system comprising the ion mill in operative communication with the control system may also comprise mechanical, electronic and/or optical components for its working. These may also be referred to as actuating elements. A worker skilled in the art would readily understand such mechanical, electronic and/or optical components. Furthermore, the control system may be programmed to control the system as a whole upon receiving input from a user.

According to some embodiments, the control system may comprise, a central control panel or board, at least one computer, processor/microprocessor, or central processing unit (CPU), along with associated computer software, one or more storage units/devices, power supplies, power converters, controllers, controller boards, various printed circuit boards (PCBs), for example, including input/output (I/O) and D/A (digital to analog) and A/D (analog to digital) functionalities, cables, wires, connectors, shielding, grounding, various electronic interfaces, and network connectors. The control system may be operatively connected and integrated with the ion mill and its various components.

The control system may further comprise one or more storage units to store predetermined information regarding removal rates for one or more materials and one or more ion mill operating characteristics or parameters. In addition, the stored information may be predetermined rates associated with their corresponding sets of ion mill operating parameters/characteristics for one or more materials. The predetermined rates may be obtained as explained in various aspects of the disclosure herein.

According to some embodiments, the control system may be used to operate the ion mill to perform delayering of a sample by entering appropriate inputs. The inputs may be provided to the control system via a control panel or any input device as would be readily known to a worker skilled in the art. The control system, upon receiving inputs, adjusts one or more ion mill operating characteristics to perform removal of one or more materials from a sample at their respective predetermined rates.

According to some embodiments, the input may include, but is not limited to the following: an individual value associated with just one ion mill operating parameter, one or more values associated with one or more ion mill operating parameters, the rate of removal of one or more materials, the delayering thickness or thickness of removal of one or more materials, the time period for removal of one or more materials, the one or more materials to be removed, sets of ion mill operating characteristics, execution time periods associated with one or more sets of ion mill operating characteristics, the sequence in which various sets of ion mill operating characteristics are to be executed, or any combinations thereof.

The control system may be programmed to automatically control one or more ion mill operating characteristics upon receiving an input from a user. For example, the input provided by a user may be to remove Cu from a sample for a certain period of time. Upon receiving this input from the user, the control system may, automatically, using the respective predetermined information associated with removal of Cu from a storage medium, adjust the one or more ion mill operating parameters to remove Cu for that period of time.

As another example, the user input may be to delayer a certain thickness of a sample. Upon receiving this input, the control system may automatically, using the relevant components of the delayering system, perform the following functions: detect the one or materials that may be present on the surface of the layer to be delayered, obtain the respective predetermined information associated with the removal of one or more materials from that layer, and adjust the one or more ion mill operating characteristics to delayer the sample to the desired thickness. One or more of the functions may be repeated until the specified thickness of the sample is delayered.

According to some embodiments, the control system may comprise a feedback system. The feedback system may be part of the entire system used for delayering a sample. The feedback system may use any detection mechanism to analyze, in real-time, the delayering of a sample. The detection mechanism may detect various facets of the delayering process as would be necessary to control the operation for optimal performance. A worker skilled in the art would readily know the various facets that need to be detected for optimization of the operation. The detected facets may be analyzed by the one or more processors. The analyzed results may then be used to automatically control one or more ion mill operating parameters or sets of operating parameters to optimally selectively delayer the sample. The detection mechanism may use a SIMS system. A worker skilled in the art would readily understand various detection mechanisms and detection systems/units.

Various Aspects of the Subject Matter Disclosed Herein:

In the instant application, there is further provided a method of de-layering ICs using an ion beam system, the ICs (or other sample) comprising one or more materials, wherein rates of de-layering any of the one or more materials can be selectively controlled by adjusting one or more ion beam system parameters, the method comprising the steps of introducing an IC (or other sample) in a target path of an ion beam in the ion beam system, configuring the ion beam system to set each of the one or more parameters at respective predetermined levels that are associated with predetermined de-layering rates for each of the respective materials in the IC (or other sample); causing the ion beam gun to direct an ion beam at the IC (or other sample).

Other steps may include one or more of the following:
  removing the IC (or other sample) after removal of a layer, analyzing the IC, repeating;
  feedback control using a de-layered material detection element to assess progress of removal of layer or of detected materials in the sample to automatically and in real-time control selectivity or non-selectivity of material in any given layer or sample;
  removing substantially uniform layers comprising of homogeneous or non-homogeneous materials;
  introducing topographical surface enhancements by favouring certain material-specific milling rates; or
  selectively favouring certain material-specific milling rates to concurrently delayer the sample and introduce material-specific topographical enhancements.

In some embodiments, there is also disclosed a method of determining relative de-layering rates of various materials using the system of the instant disclosure. The method comprises the steps of using the system described above to de-layer an known material and determine de-layering rates as a function of one or more parameters (including any interaction effects in respect of each of the one or more parameters and how interaction between each such parameter may impact said de-layering rates); repeating for one or more additional materials; optionally storing all such empirically gathered information in a data storage element for use by control system to automatically control selectivity levels of materials present in any given sample.

In another embodiment, there is provided an ion beam system for selectively de-layering ICs, the ICs comprising of one or more materials, the ion beam system comprising a chamber, one or more ion beam sources, and one or more a target stage. The system may optionally comprise additional elements to introduce various gases into the chamber, target stage control elements, and the following elements associated with any of the one or more ion beam sources: apertures, electrostatic lenses (condensors and objective); and all actuators necessary to adjust the one or more parameters.

Other components according to some embodiments disclosure may include one of more of the following:
  Data storage component: for storing predetermined information regarding parameters and parameter effects on de-layering rates of materials;
  Parameter actuator: various actuators on the ion beam system to automatically, in response to signals received from the control element, to adjust parameters;
  Control element (e.g. a computer processor): the control element, based on predetermined information contained in the data storage component, and/or information received from the detection element, configured to send signals to the various parameter actuators to control adjustment of said parameters; and De-layering material detection element (e.g. SIMS): this refers to a detection element capable of detecting or measuring changes in the sample that relate to de-layering or etching, such as the existence and quantity of different materials, the existence or physical, chemical or electrical characteristics of features on the sample as they become de-layered or material adjacent thereto becomes de-layered.

Some further aspects relate to the use of a broad beam ion milling system for de-layering layers of semiconductor die on a layer-by-layer basis, including through the methods and systems disclosed herein. Such aspects may include the use of an ion milling system to remove very thin layers of an IC to expose the underlying circuitry across the whole die. Each layer may be made up of a mixture of materials (metals and dielectrics) in varying shapes and structures.

The ion mill, according to some embodiments may consist of, for example, a large diameter gridded ion beam source and a variable angle cooled substrate stage that can be tilted and rotated, housed in a vacuum pumped process chamber. Various gas injection systems can deliver different process gasses, while a plasma bridge neutralizer is used to neutralize the ion beam. Vacuum gauges, a load-lock, vacuum pumps and computer complete the package. SIMS endpoint detection can be installed to help with accurately controlling the etch times.

Other de-layering material detection elements can be used and may include visual detection, other mass spectroscopy tools, or other chemical detection tools known to a worker skilled in the art.

The parameters of the use of the ion gun and associated target can be adjusted in order to control milling characteristics. Some of these parameters, which may affect the beam conditions, chamber conditions, sample conditions and orientation, and use of other materials in the beam or other material streams directed to the sample, can affect different milling characteristics. For example, by controlling the beam conditions (accelerating voltage, current), the gasses used (amount, type, and precisely where they are injected), the gun-to-sample angle, sample cooling and sample rotation speed, the milling characteristics of the semiconductor die materials may be controlled. Other parameters may include one or more of the following: Chamber—base pressure, cross-over pressure, process pressure;

Load—lock base pressure, cross-over pressure;

Stage—linear location, angle, rotation speed, temperature;

Ion Source—RF power (fwd/reflected), accelerator voltage, accelerator current, beam voltage, beam current, extractor grid configuration (material, size, number and grid pattern of the extractor grids);

Plasma bridge neutralizer—cathode voltage, emission current;

Gas injection—PBN gas flow, source gas flows and types (could be multiple, could be inert or reactive), background gas flows and types (could be multiple);

Time—process step(s) time(s), number and order of steps (could use a series of different process conditions in a particular sequence);

Angle of the sample-to-gun (covers both moveable sample and moveable gun) is adjusted to select optimum etching rates and sidewall angle; and Any of the parameters in known ion beam systems.

Selectivity (differential etch rate) between different materials used in the circuit layouts or other samples may depend on all, or some of those listed parameters and/or interaction effects therebetween. They can be adjusted and manipulated to allow selective etching (removing only a specific material type) or non-selective etching (removing all material at similar rates), allowing for accurate and precise removal of the homogenous and non-homogenous layers of an integrated circuit. The thickness of the removed layer, whether homogeneous or non-homogeneous, can therefore be made uniformly or substantially uniformly (and in any case significantly less than any stratum deposited in an IC), and/or deliberately favouring one particular material to introduce topographical enhancements of interest.

The rate of removal for any given material as a function of one or more parameters can be predetermined and stored in a data storage component that is associated with systems and devices for carrying out the subject matter disclosed herein. This data may be collected based on empirical measurements that are systematically carried out by adjusting one or more parameters and then measuring de-layering rates for a particular material. By carrying out multi-factored analyses that assess de-layering rates relative to changes in various parameters, the interactive effects between such changes can also be predetermined and stored in the data storage component. Accordingly, the ion beam system can be configured to use the predetermined parameter de-layering parameter effects to carry out de-layering with a precise level of desired selectivity.

In some embodiments, the methods and systems disclosed herein are used to de-layer a target in a way that leverages the ability to selectively remove or etch layers that comprise multiple materials and are non-homogeneous. One application of this use is to provide for greater ease of visual and other types of analysis layer by layer. This is particularly useful in reverse engineering applications. While it may be an object to remove a layer of very uniform thickness across a non-homogenous target in order to analyze such layers underneath, it may also be an object to remove material surrounding a structure of a different material in order to more easily analyze (visually, electrically or otherwise) a particular material within a given layer. In other examples, the systems and methods disclosed herein may be used for deposition of materials onto the target to protect or pre-process that layer so that analysis or reverse engineering for a given layer is made possible. For example, once sufficient layers have been removed for analysis of a particular layer, it may be necessary to protect a layer from ambient conditions outside the ion beam chamber, and to expose the target for subsequent analysis of a particular layer. In other cases, material in a given layer may be pre-processed in order to make it more amenable to (a) etching at rates similar to other materials in the given layer that is non-homogeneous including etching using ion beam mill or other types of etching known in the art; and/or (b) analysis, visual or otherwise (for example, the surface characteristics of one material in a particular structure may be roughened or have material adsorbed or absorbed thereto to facilitate analysis). All of these objectives can be selectively managed and controlled by controlling the various parameters according to the systems and methods disclosed herein.

According to another embodiment, the parameters are controlled to manage the relative side-wall etching rates versus the de-layering etching rates. This may include, in some aspects, minimizing sidewall etching in a direction perpendicular to the direction of delayering.

The various parameters can also be used to control reaction rates selectively with various materials present on a sample when reactive species are introduced into the chamber and/or used as or mixed with the matter ejected from the ion beam source. Other objectives that can be achieved by controlling the parameters include the changes to surface roughness, chemical damage/modification, and physical damage/modification.

Some embodiments of the systems and methods described herein are configured to etch, deposit, or pre-process material from a sample uniformly across samples, even when the sample is large or very large, relative to the depth of the beam effect.

The parameters can be adjusted to selectively remove certain materials at different rates relative to another material that may be found in a given layer, so as to remove some materials and not others. Alternatively, the parameters can be adjusted to ensure substantially equal rates of de-layering to evenly remove extremely thin layers across large areas (in particular where the thickness of the layer removed is much smaller than the length or width of the sample in the plane of the layer). In some applications, the length and/or width may be in the range of 5-20 centimeters and the thickness of the removed layer may be in the range of picometers to nanometers.

Control system using feedback control of the SIMS measurement to determine rate of delayering and presence of de-layered material, or changes thereof. This can be used as part of a feedback control system to cause de-layering of desired materials at desired rates.

Exemplary Embodiments Vacuum System

Appropriately sized vacuum chamber to support automatic sample load/unload through an isolation lock. Accommodating the sample stage, ion-source, pumping ports, gas supply ports and ancillary viewing and monitoring features.

Fast pumping capability supporting process pressures in the 5e-4 regime with a leak rate less than 5e-5 torr 1/s.

Sample Stage:

Capable of accepting a 4" diameter sample. Temperature controlled (cooled) to allow constant temperature operation. Thermal conduction from sample to stage. Rotation of sample about the central axis, and tilting in the plane of the ion-source from normal (+/−90 deg) to 0 degrees.

Shutter control protection of the sample during run-up and process-setting changes.

Ion Source:

12 cm diameter RF ICP auto impedance-matched with dual-grid focused output. Control of accelerating voltage, extraction voltage and beam current in the range of about 0-1000V, 0-500 mA.

Gas Supply:

MFC controlled ion-source supply of noble or reactive gas and chamber background gas for chemical-mill enhancement. Also supply for PBN.

PBN:

Argon supplied ionizer injecting an electron stream for ion-beam neutralization.

De-Layering:

Every surface factor affects the milling process—material, topography, roughness, feature width, spacing, and the influence is dynamic in nature. The instant ion beam milling system is configured to match material rates as much as possible, and deal with feature topography through multiple beam angle/current application steps. One way to de-convolve all of these different effects from adjustments to parameters is to monitor effects by "trial and error" as much as predictable rate matching.

Another difficulty is to know where in the vertical structure the process is at any given time. A "material monitor" can be used to determine variations in the material mix and capturing new materials as they are uncovered—i.e. end-point detection. A SIMS detector can be configured to be a "material monitor".

Another tool for influencing etch rates/selectivity is the use of additional or substitutional gasses either directly in the ion-source (reactive), or as a background gas fragmented by the ion-beam then able to selectively react on the surface.

Each step of the method disclosed herein may be executed on any computing device, such as a personal computer, server, PDA, or the like and pursuant to one or more, or a part of one or more, program elements, modules or objects generated from any programming language, such as C++, Java, C, or the like. In addition, each step, or a file or object or the like implementing each said step, may be executed by special purpose hardware or a circuit designed for that purpose.

While the present disclosure describes various embodiments for illustrative purposes, such description is not intended to be limited to such embodiments. On the contrary, the applicant's teachings described and illustrated herein encompass various alternatives, modifications, and equivalents, without departing from the embodiments, the general scope of which is defined in the appended claims. Except to the extent necessary or inherent in the processes themselves, no particular order to steps or stages of methods or processes described in this disclosure is intended or implied. In many cases the order of process steps may be varied without changing the purpose, effect, or import of the methods described.

Information as herein shown and described in detail is fully capable of attaining the above-described object of the present disclosure, the presently preferred embodiment of the present disclosure, and is, thus, representative of the subject matter which is broadly contemplated by the present disclosure. The scope of the present disclosure fully encompasses other embodiments which may become apparent to those skilled in the art, and is to be limited, accordingly, by nothing other than the appended claims, wherein any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims. Moreover, no requirement exists for a system or method to address each and every problem sought to be resolved by the present disclosure, for such to be encompassed by the present claims. Furthermore, no element, component, or method step in the present disclosure is intended to be dedicated to the public regardless of whether the element, component, or method step is explicitly recited in the claims. However, that various changes and modifications in form, material, work-piece, and fabrication material detail may be made, without departing from the spirit and scope of the present disclosure, as set forth in the appended claims, as may be apparent to those of ordinary skill in the art, are also encompassed by the disclosure.

What is claimed is:

1. A method of reverse engineering a sample of unknown structure using an ion beam mill comprising an electron detector configured to detect backscattered and secondary electrons, the method comprising:

identifying at least two materials in an exposed surface of an integrated circuit (IC) of unknown structure and predetermined operational characteristics of the ion beam mill that correspond with a substantially different ion beam mill removal rate for at least one of said materials;

operating the ion beam mill in accordance with said predetermined operational characteristics to simultaneously remove said materials, using an ion beam from the ion beam mill, such that said at least one of said materials is milled at said substantially different ion beam removal rate so to introduce or enhance a material-specific topography and edges thereof at an interface of a circuit portion of the IC of unknown structure;

acquiring surface data from a newly exposed surface of the IC of unknown structure by:
  obtaining surface data of edges of the newly exposed surface at the interface by relying on enhanced emissions of secondary electrons at said interface as detected by said electron detector; and
  obtaining surface data of flat surfaces of the other portions of the newly exposed surface by relying on emissions of backscattered electrons as detected by said electron detector; and repeating said operating and acquiring steps for at least one more layer, said acquired surface data for reverse engineering at least the circuit portion of the IC of unknown structure based on one or more images generated from said surface data, wherein surface data corresponding with said edges are brighter in said images than surface data associated with said other portions of the topography due to contribution from enhanced emissions of secondary electrons as detected by said electron detector.

2. The method of claim 1, wherein:
said predetermined operational characteristics are second predetermined operational characteristics; and
the method further comprises, prior to said operating the ion beam mill in accordance with said second predetermined operational characteristics:
identifying first predetermined operational characteristics of the ion beam mill that correspond with a substantially identical ion beam mill removal rate for each of said materials; and
operating the ion beam mill in accordance with said first predetermined operational characteristics to simultaneously remove, using said ion beam from the ion beam mill, each of said materials at said substantially identical ion beam mill removal rate so to remove a substantially planar layer of substantially constant thickness from the exposed surface of the IC of unknown structure.

3. The method of claim 1, further comprising producing hierarchical circuit schematics using said acquired surface data.

4. The method of claim 1, wherein said predetermined operational characteristics are any one or more of the following: angle of sample-to-ion beam direction, ion beam size, beam spread, beam shape, ion type, sample stage temperature, chamber base pressure, chamber cross-over pressure, chamber process pressure, sample stage linear location, sample stage angle, sample stage rotation speed, ion source accelerator voltage, ion source accelerator current, ion source beam voltage, ion source beam current, ion source extractor grid configuration, ion source extractor grid material, ion source RF power, extraction voltage, direct or reflected ion beam, plasma bridge neutralizer (PBN) cathode voltage, PBN emission current, PBN gas flow, ion source type, ion source gas flow rate, chamber background gas type, chamber background gas flow rate, chamber temperature, sidewall angle, type of gas present in chamber, flow rate of gas introduced into chamber, or temperature of gas in chamber.

5. The method of claim 1, wherein said ion beam mill is one of a broad ion beam mill or a focused ion beam mill.

6. The method of claim 1, wherein said topography has a height in a range of 5 to 15 nm.

7. The method of claim 1, wherein said acquiring comprises acquiring a scanning electron microscope (SEM) image of said newly exposed surface, and wherein said SEM image comprises a secondary electron (SE) contribution.

8. A system for reverse engineering a sample of unknown structure using an ion beam mill, the system comprising:
an ion beam mill comprising an electron detector configured to detect backscattered and secondary electrons; and
a control system in operative communication with said ion beam mill to operate said ion beam mill in accordance with predetermined operational characteristics that correspond with a substantially different ion beam mill removal rate for at least one of materials identified in an exposed surface of an integrated circuit (IC) of unknown structure; and
an imaging system for acquiring surface data corresponding to said IC of unknown structure based on backscattered and secondary electrons detected by said electron detector;
wherein operation of the ion beam mill in accordance with said predetermined operational characteristics simultaneously removes said materials, using an ion beam from the ion beam mill, such that said at least one of said materials is milled at said substantially different ion beam removal rate so to introduce or enhance a material-specific topography and edges thereof at an interface of a circuit portion of the IC of unknown structure;
wherein said control system is operable to operate said ion beam mill for imaging a newly exposed surface of the IC of unknown structure by:
  obtaining surface data of said edges of the newly exposed surface at edges of the newly exposed surface based on enhanced emissions of secondary electrons at said interfaces; and
  obtaining surface data of flat surfaces of the other portions of the newly exposed surface by relying on emissions of backscattered electrons; and
wherein said imaging system generates one or more images from said surface data, wherein surface data corresponding with said edges are brighter in said images than surface data associated with said other portions of the topography due to enhanced emissions of secondary electrons.

9. The system of claim 8, wherein said acquiring comprises acquiring a scanning electron microscope (SEM) image of said newly exposed surface.

10. The system of claim 8, wherein:
said predetermined operational characteristics are second predetermined operational characteristics; and
said control system is operable in accordance with first predetermined operational characteristics that correspond with a substantially identical ion beam mill removal rate for each of said materials so to remove a substantially planar layer of substantially constant thickness from the exposed surface of the IC of unknown structure prior to operating the ion beam mill in accordance with said second predetermined operational characteristics.

11. The system of claim 8, wherein said predetermined operational characteristics are any one or more of the following: angle of sample-to-ion beam direction, ion beam size, beam spread, beam shape, ion type, sample stage temperature, chamber base pressure, chamber cross-over pressure, chamber process pressure, sample stage linear location, sample stage angle, sample stage rotation speed, ion source accelerator voltage, ion source accelerator current, ion source beam voltage, ion source beam current, ion source extractor grid configuration, ion source extractor grid material, ion source RF power, extraction voltage, direct or reflected ion beam, plasma bridge neutralizer (PBN) cathode voltage, PBN emission current, PBN gas flow, ion source type, ion source gas flow rate, chamber background gas type, chamber background gas flow rate, chamber temperature, sidewall angle, type of gas present in chamber, flow rate of gas introduced into chamber, or temperature of gas in chamber.

12. The system of claim 8, wherein said ion beam mill is one of a broad ion beam mill or a focused ion beam mill.

13. The system of claim 8, wherein said topography has a height in a range of 5 to 15 nm.

14. The method of claim 1, wherein the ion beam operates in the presence of one of a non-reactive gas or a reactive gas.

15. The system of claim 8, wherein the ion beam operates in the presence of one of a non-reactive gas or a reactive gas.

16. The system of claim 8, wherein emissions of secondary electrons provide topographical contrast in the one or more images between a first feature formed by a first material and a second feature formed by a second material with same atomic number as the first material.

17. The method of claim 1, wherein emissions of secondary electrons as detected by said electron detector provide topographical contrast in the one or more images between a first feature formed by a first material and a second feature formed by a second material with same atomic number as the first material.

* * * * *